Sept. 3, 1968 N. H. ISHMAN 3,400,338

WIDE BAND VOLTAGE CONTROLLED OSCILLATOR

Filed March 23, 1967

INVENTOR
NEAL H. ISHMAN

BY Hurvitz, Rose & Greene
ATTORNEYS

United States Patent Office 3,400,338
Patented Sept. 3, 1968

3,400,338
WIDE BAND VOLTAGE CONTROLLED OSCILLATOR

Neal H. Ishman, Springfield, Va., assignor to Melpar, Inc., Falls Church, Va., a corporation of Delaware Filed Mar. 23, 1967, Ser. No. 625,528
3 Claims. (Cl. 331—117)

ABSTRACT OF THE DISCLOSURE

A wideband voltage controlled oscillator in which a parallel resonant circuit is used as an isolation network between a tuning voltage supply (modulation signal) and the voltage controlled oscillator to compensate automatically for amplitude variations and phase shift normally introduced by the combination of resistance of the isolation network and capacitance of the oscillator tuned network. The parallel resonant circuit is designated to resonate at center or design frequency of the oscillator so that at that frequency the isolation impedance is essentially purely resistive, while at low modulation signal frequencies an inductive reactance component predominates.

*Background of the invention*

The present invention relates generally to oscillators, and more particularly to voltage controlled oscillator circuits incorporating phase and amplitude compensation networks to provide marked increase in modulation bandwidth capability.

It is frequently necessary or desirable, in the implementation of phase-locked loops for frequency synthesizer or receiver local oscillators, and in other applications such as FM signal generators, data transmitters, and telemetry data links, to provide oscillators whose output frequency can be controlled over a relatively wide modulation bandwidth by signal voltages (modulating signals) representative of information or intelligence to be impressed as frequency variations on the oscillator output frequency. In the case of phase-locked loops in FM receivers, for example, it is desirable to provide a relatively wide locking range to permit true tracking of amplitude and phase between modulating frequency and FM signal. In the past, the typical voltage controlled oscillator circuit has been capable of only limited modulation bandwidth because the conventional use of a fixed A-C isolation resistor between the tuning voltage input (modulation signal) and the variable reactance (resonant circuit) of the oscillator introduces circuit elements producing an R-C (resistance-capacitance) roll off of amplitude and phase shift.

*Summary of the invention*

According to the present invention, a coupling network is provided between the modulation signal input and the variable reactance elements of the oscillator, the coupling network being arranged and adapted to present an isolation impedance which is purely resistive, from an engineering standpoint (i e., when order of magnitudes is considered), at the center or design frequency of the oscillator and purely reactive, again, from an engineering standpoint, at the wide limits or ends of the modulation frequency range. The reactive impedance is selected to compensate for the otherwise usual and undesired roll off effect of the reactive component of the resonant circuit of the oscillator in the low frequency portions of the modulation frequency range i.e., where severe roll off of amplitude and phase shift would otherwise occur, thereby preserving low phase shift and constant amplitude over a substantially greater modulation bandwidth than has heretofore been achieved. In a preferred embodiment of the invention the coupling network or compensation circuit comprises a parallel resonant circuit including a voltage variable capacitor in one path and in a parallel path, an inductor selected to resonate with the capacitor at the operating (i.e., center or design) frequency of the voltage controlled oscillator (VCO).

Accordingly, it is a principal object of the present invention to provide a wide band voltage controlled oscillator.

It is a more specific object of the invention to provide a voltage controlled oscillator circuit including a coupling network for automatic compensation of amplitude and phase shift of the tuned circuit of the oscillator, to achieve a modulation bandwidth at least two orders of magnitude greater than that which is obtained in prior art voltage controlled oscillator circuits.

A further object of the present invention is to provide simple and efficient compensating networks for extending the modulation bandwidth capability of voltage controlled oscillators.

*Brief description of the drawing*

The above and still further objects, features and attendant advantages of the present invention will become apparent from a consideration of the following detailed description of a preferred embodiment thereof, especially when taken in conjunction with the accompanying drawings, in which.

*Description of the preferred embodiment*

Figure 1:
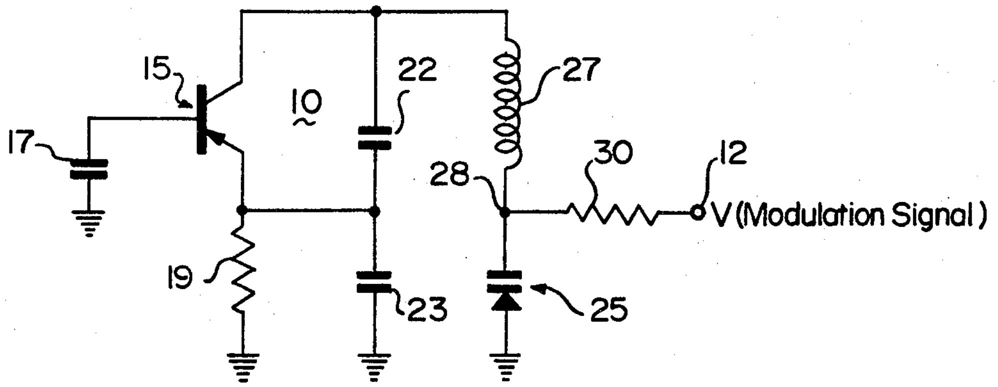
FIG. 1 PRIOR ART
FIGURE 1 is a circuit diagram of a typical prior art voltage controlled oscillator.

Referring now to the drawings, wherein like reference numerals are used to designate like componentes in the circuits shown by the two figures, the A-C circuit diagram of FIGURE 1 represents a conventional voltage controlled oscillator 10 having a preselected center frequency and capable of having its output frequency varied from the center frequency by modulation signal applied at terminal 12. In a typical application, VCO 10 might be used in the phase-locked loop of an FM receiver, and in such case it is essential that there be an accurate track of amplitude and phase between modulating frequency and FM signal.

VCO 10 typically comprises an active device or amplifier such as transistor 15, an A-C bypass capacitor 17 coupled to the base electrode of the transistor, an emitter resistor 19, a pair of impedance matching capacitors 22 and 23 series connected between collector and ground and having their common junction connected to the emitter of transistor 15, and a series resonant circuit including a voltage variable capacitor 25 (e.g., a varactor) for tuning the VCO and a tuning inductor 27 selected to resonate with capacitor 25. The output frequency of the oscillator is modulated by signal, generally ranging upward from very low frequencies, applied at terminal 12 to the junction 28 between the tuning elements of the oscillator via a fixed A-C isolation resistor 30. As the modulation signal approaches the lower frequencies of interest the curves of amplitude versus frequency and phase shift versus frequency for the circuit of FIGURE 1 tend to roll off rapidly, as determined by the resistance and capacitance of elements 30 and 25, respectively, thereby imposing a severe limit upon the modulation bandwidth of the circuit. Accordingly, any attempt to maintain accurate tracking in the phase-locked loop, for example, is vitiated by the realizable response of the VCO and its associated coupling network.

Figure 2:
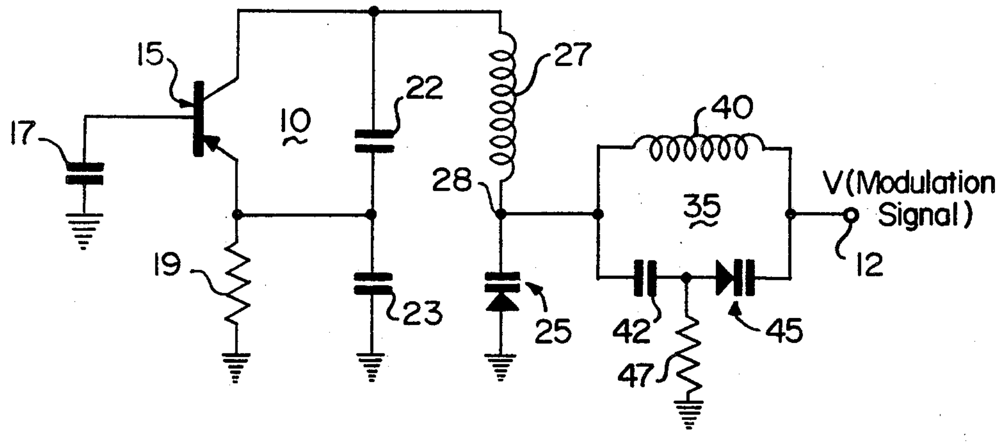
FIGURE 2 is a circuit diagram of a preferred embodiment of the voltage controlled oscillator according to the present invention.

In order to improve this condition, I provide a coupling network for the VCO which operates to compensate for amplitude variations and phase shift down to the low modulating frequencies of interest. The A-C circuit for the VCO and associated coupling network according to my invention is shown in FIGURE 2. It will be observed that the VCO corresponds to that illustrated in FIGURE 1, the novelty residing in the manner in which the oscillator is coupled to the source of modulation signal.

Coupling network 35 comprises a parallel resonant circuit connected between terminal 12 and junction 28 of the oscillator. One circuit path of network 35 includes a tuning inductor 40, and the other parallel path a voltage variable capacitor 45 (again, a varactor, for example) connected in series with a D-C blocking capacitor 42, the junction of the two capacitors coupled to ground (reference potential) via a resistor 47 which acts as a D-C return for the capacitor 45 bias. Parallel resonant circuit 35 is designed to resonate at the operating frequency of voltage controlled oscillator 10; hence, it presents an isolation impedance which is purely resistive at the oscillator frequency, i.e., a resistance equal to Q times the reactance of one of the paths, where Q has its conventional definition of ratio of inductive reactance to total series resistance of the resonant circuit. To this extent, the coupling network operates identically to the fixed A-C isolation resistor 30 of FIGURE 1, in conjunction with VCO 10. At the lower frequencies of the modulation frequency range of interest, however, the impedance of inductor 40 becomes the dominant impedance of compensation tank circuit (coupling network) 35, and as modulation frequency decreases the compensation tank impedance approaches the inductive impedance alone. Accordingly, an extremely low impedance path is presented for modulation signal between terminal 12 and mode 28.

If the circuit of FIGURE 2 is used with a low impedance modulating signal source, the frequency response of the circuit is extended by at least two orders of magnitude over that available with the circuit of FIGURE 1. The ratio of modulation frequency to center frequency exceeds ten percent for voltage controlled oscillators in accordance with the invention, a substantial improvement in modulation bandwidth over that provided by related prior art circuits.

While I have disclosed a preferred embodiment of my invention, it will be apparent that variations in the specific details of construction which have been illustrated and described may be resorted to without departing from the spirit and scope of the invention, as defined in the appended claims.

I claim:

1. A wide band voltage controlled oscillator, comprising an amplifier, a voltage tunable circuit coupled to said amplifier to effect oscillations of said oscillator over a range of frequencies about a predetermined center frequency, a source of modulating voltage, and means coupling said voltage source to said tunable circuit to vary the frequency of oscillations of said oscillator in accordance with said modulating voltage; said coupling means comprising a network having an impedance which is substantially entirely resistive to modulating voltage of said predetermined center frequency and substantially entirely reactive, to compensate reactive impedance of said tunable circuit tending to produce amplitude variations and phase shift at the ends of said frequency range, to modulating voltage of frequencies at approximately said ends of said frequency range.

2. In combination, a voltage controlled oscillator for use with a source of modulation signal, said oscillator including an amplifier, a resonant circuit for said amplifier to produce oscillations at a preselected operating frequency, said resonant circuit including a voltage variable capacitor for receiving said modulation signal to frequency modulate said oscillator; and compensating means for applying said modulation signal to said oscillator to increase the modulation bandwidth of said oscillator, said compensating means comprising a parallel resonant circuit including an inductor in one path and a voltage variable capacitor in the other path, said parallel resonant circuit tuned to resonate at said preselected operating frequency and for providing a predominately inductive reactance at modulation signal of frequency below said preselected operating frequency, whereby to provide a low impedance path at relatively low modulation signal frequencies and a substantially purely resistive path for modulation signal of said preselected operating frequency.

3. The invention according to claim 4 wherein said network is a parallel resonant circuit having a parallel pair of signal translation paths, one of said paths having an inductor therein and the other of said paths having a voltage variable capacitor therein, said parallel resonant circuit having component values selected to produce resonance of said parallel resonant circuit at approximately said predetermined center frequency.

References Cited

UNITED STATES PATENTS

| | | | |
|---|---|---|---|
| 3,068,427 | 12/1962 | Weinberg | 332—30 |
| 3,290,618 | 12/1966 | Leysieffer | 331—36 |
| 3,302,138 | 1/1967 | Brown et al. | 331—177 |
| 3,353,126 | 11/1967 | Schucht | 331—36 |

JOHN KOMINSKI, *Primary Examiner.*